United States Patent
Lu et al.

(10) Patent No.: US 7,388,396 B2
(45) Date of Patent: Jun. 17, 2008

(54) STRIP TEST METHOD

(75) Inventors: Hsin-Chieh Lu, Kaohsiung (TW); Chao-Hsiung Hwu, Tainan (TW)

(73) Assignee: Advanced Semiconductor Engineering Inc., Kaohsiung (TW)

( * ) Notice: Subject to any disclaimer, the term of this patent is extended or adjusted under 35 U.S.C. 154(b) by 46 days.

(21) Appl. No.: 11/557,381

(22) Filed: Nov. 7, 2006

(65) Prior Publication Data

US 2007/0152698 A1    Jul. 5, 2007

(30) Foreign Application Priority Data

Jan. 2, 2006    (TW) .............................. 95100026 A

(51) Int. Cl.
    *G01R 31/26*    (2006.01)
(52) U.S. Cl. ..................................... 324/765
(58) Field of Classification Search ................ 324/754, 324/761–762, 765, 158.1, 760, 763; 438/14, 438/15; 257/48

See application file for complete search history.

(56) References Cited

U.S. PATENT DOCUMENTS 6,245,583 B1 * 6/2001 Amador et al. ............... 438/14
6,278,618 B1 * 8/2001 Lee et al. .................... 361/820
6,720,786 B2 * 4/2004 Song et al. .................. 324/765

* cited by examiner

*Primary Examiner*—Ha Tran Nguyen
*Assistant Examiner*—Tung X Nguyen

(57) ABSTRACT

A strip test method includes the following steps. First, an assembly strip is provided, wherein the assembly strip includes a plurality of semiconductor devices, each having a plurality of leads. A test socket and a base are provided, wherein the test socket has a plurality of probe sets. The assembly strip is loaded to the base. The probe sets electrically contacts the leads of the semiconductor devices simultaneously and respectively so as to process an electrical test. When one of the semiconductor devices is failed in the electrical test, one of the base and the test socket are relatively moved in such a manner that the failed one of the semiconductor devices is corresponding to one of the probe sets which is successful in the electrical test and is the nearest to the failed one of semiconductor device. Finally, the successful and nearest one of probe sets simultaneously and electrically contacts the leads of the failed one of the semiconductor devices so as to process another electrical test again.

7 Claims, 5 Drawing Sheets

STRIP TEST METHOD

CROSS REFERENCE TO RELATED APPLICATION

This application claims the priority benefit of Taiwan Patent Application Serial Number 095100026, filed Jan. 2, 2006, the full disclosure of which is incorporated herein by reference.

BACKGROUND OF THE INVENTION

1. Field of the Invention

The present invention generally relates to a strip test method, and more particularly to a strip test method, wherein the semiconductor devices which are failed in the first electrical test can be electrically tested again by the probe set in which the electrical test is successful in the first electrical test.

2. Description of the Related Art

U.S. Pat. No. 6,720,786, entitled "Lead Formation, Assembly Strip Test and Singulation System" discloses an integral system for testing semiconductor devices. Referring to FIG. 1, a functional test device includes a test module 20 and a base 24. The test module 20 has a plurality of probes 22. Generally, a plurality of molded semiconductor devices 12 are assembled (packaged) on matrix-type lead frame structures in which the semiconductor devices 12 are arranged in multiple rows and columns. Before being singulated (separated) into individual molded semiconductor devices 12, the molded semiconductor devices 12 are loaded to the base 24, and then are tested while the probes 22 simultaneously, respectively and electrically contact the leads 14 of the molded semiconductor devices 12 so as to process an electrical test, thereby reducing manufacturing time and costs. The term "assembly strip 10" is adapted to describe the integral structure formed by such a matrix-type lead frame structure with the molded semiconductor devices 12 packaged thereon. The term "strip test" is adapted to describe the electrical test before the molded semiconductor devices 12 are singulated.

In addition, referring to FIG. 2, it depicts a conventional strip test method. The strip test method includes the following steps. In step 48, an assembly strip 10 is inputted in a test area. In step 50, the assembly strip 10 is loaded to the base 24. In step 52, the probes 22 of the test module 20 simultaneously, respectively and electrically contact the leads 14 of the semiconductor devices 12 of the assembly strip 10, so as to process an electrical test. In step 54, the assembly strip 10 is unloaded from the base 24. In step 56, it is judged whether any semiconductor device 12 is failed in the electrical test or not. If the answer is "No", the strip test method goes to step 58; and if the answer is "Yes", the strip test method returns to step 50. In step 58, the assembly strip 10 is outputted from the test area.

However, according to the conventional strip test method, the assembly strip will be unloaded from the base after an electrical test of the assembly strip is finished. If some semiconductor devices are failed in the electrical test, the original assembly strip must be loaded to the base again and then another electrical test of the assembly strip is processed, such that the conventional strip test method will increase manufacturing time and decrease the production output. Furthermore, when another electrical test of the assembly strip is processed again, the semiconductor devices which are failed in the first electrical test will be still corresponding to the same probes in the first electrical test. If these probes malfunction, the test result of the second electrical test of the semiconductor devices which are failed in the first electrical test may be still wrong.

Accordingly, there exists a need for a strip test method and a functional test device capable of solving the above-mentioned problems.

SUMMARY OF THE INVENTION

It is an object of the present invention to provide a strip test method, wherein the semiconductor devices which are failed in the first electrical test can be electrically tested again by the probe set in which the test is successful in the first electrical test, whereby the test result of the second electrical test of the semiconductor devices can be correct.

In order to achieve the foregoing object, the present invention provides a strip test method including the following steps. First, an assembly strip is provided, wherein the assembly strip includes a plurality of semiconductor devices, each having a plurality of leads. A test socket and a base are provided, wherein the test socket has a plurality of probe sets. The assembly strip is loaded to the base. The probe sets electrically contacts the leads of the semiconductor devices simultaneously and respectively so as to process an electrical test, i.e. the first electrical test. When one of the semiconductor devices is failed in the first electrical test, one of the base and the test socket are relatively moved in such a manner that the failed one of the semiconductor devices is corresponding to one of the probe sets which is successful in the first electrical test and is the nearest to the failed one of semiconductor device. Finally, the successful and nearest one of probe sets simultaneously and electrically contacts the leads of the failed one of the semiconductor devices so as to process another electrical test again, i.e. the second electrical test.

Compared with the prior art, the strip test method of the present invention is not required to unload the assembly strip from the base first after an electrical test of the assembly strip is finished. If some semiconductor devices are failed in the electrical test, another electrical test of the assembly strip can be directly processed so as to avoid increasing manufacturing time. Furthermore, when another electrical test of the assembly strip is processed again, the semiconductor devices which are failed in the first electrical test can be electrically tested again by the probe set in which the test is successful in the first electrical test, whereby the test result of the second electrical test of the semiconductor devices can be correct.

The foregoing, as well as additional objects, features and advantages of the invention will be more apparent from the following detailed description, which proceeds with reference to the accompanying drawings.

DETAILED DESCRIPTION OF THE PREFERRED EMBODIMENT

Figure 1:
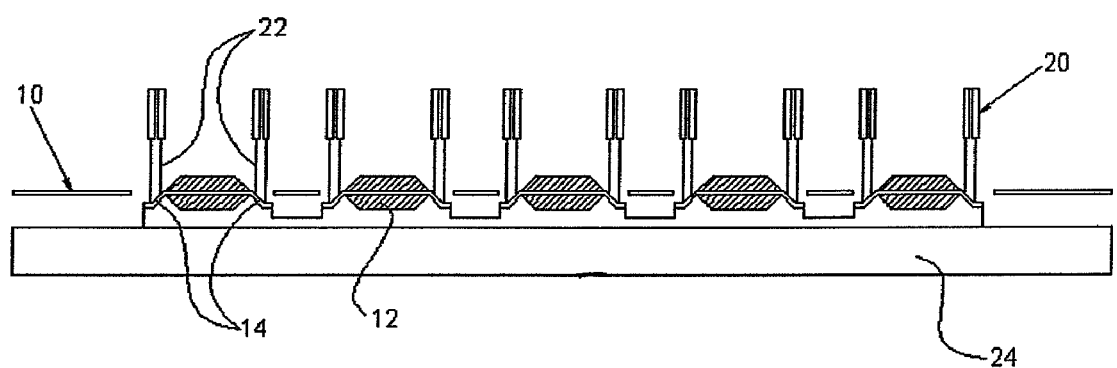
FIG. 1 is a sectional schematic view of an assembly strip in the prior art, showing an electrical test.
Figure 2:
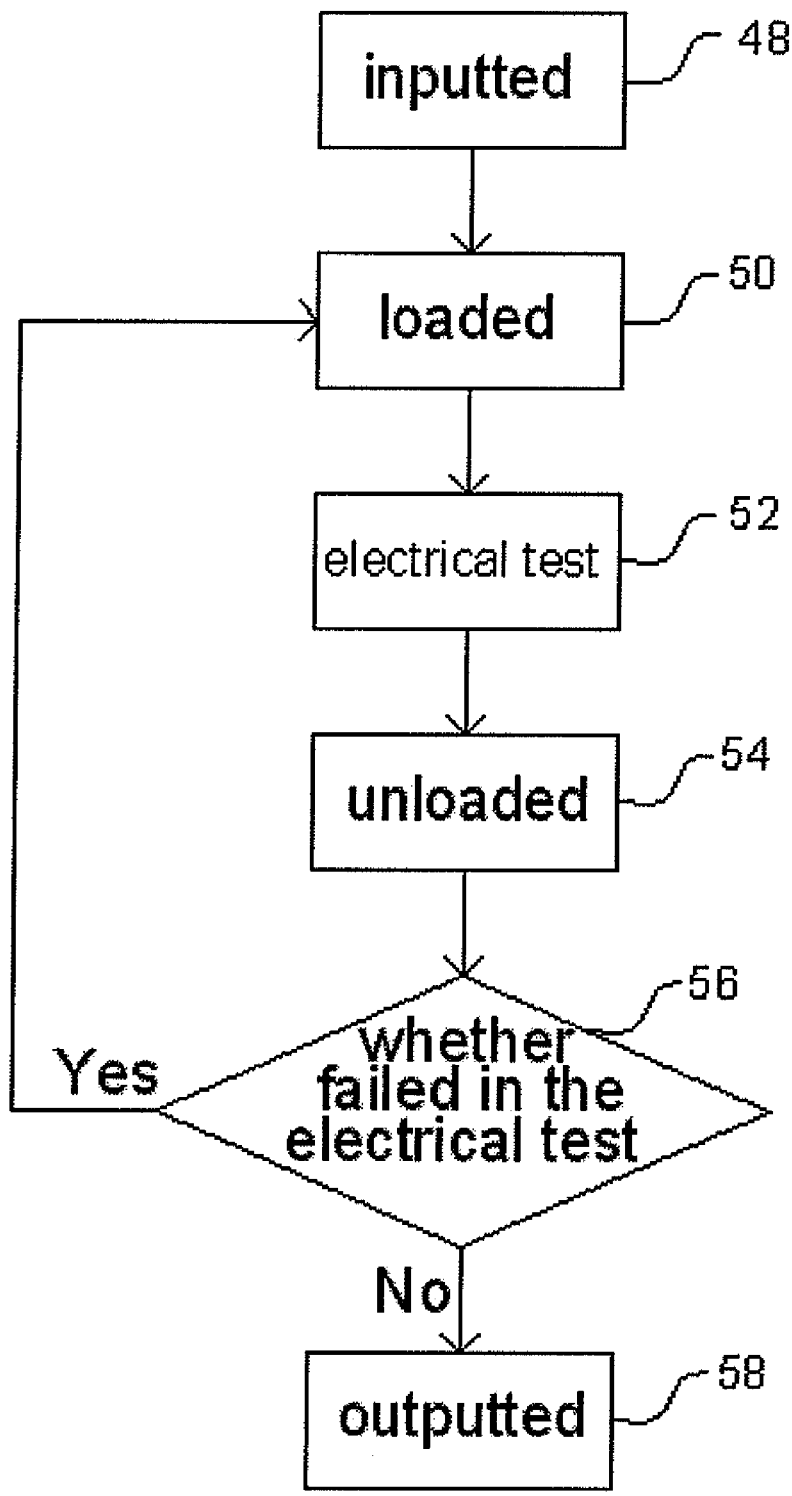
FIG. 2 is a flow chart of a strip test method in the prior art.
Figure 3:
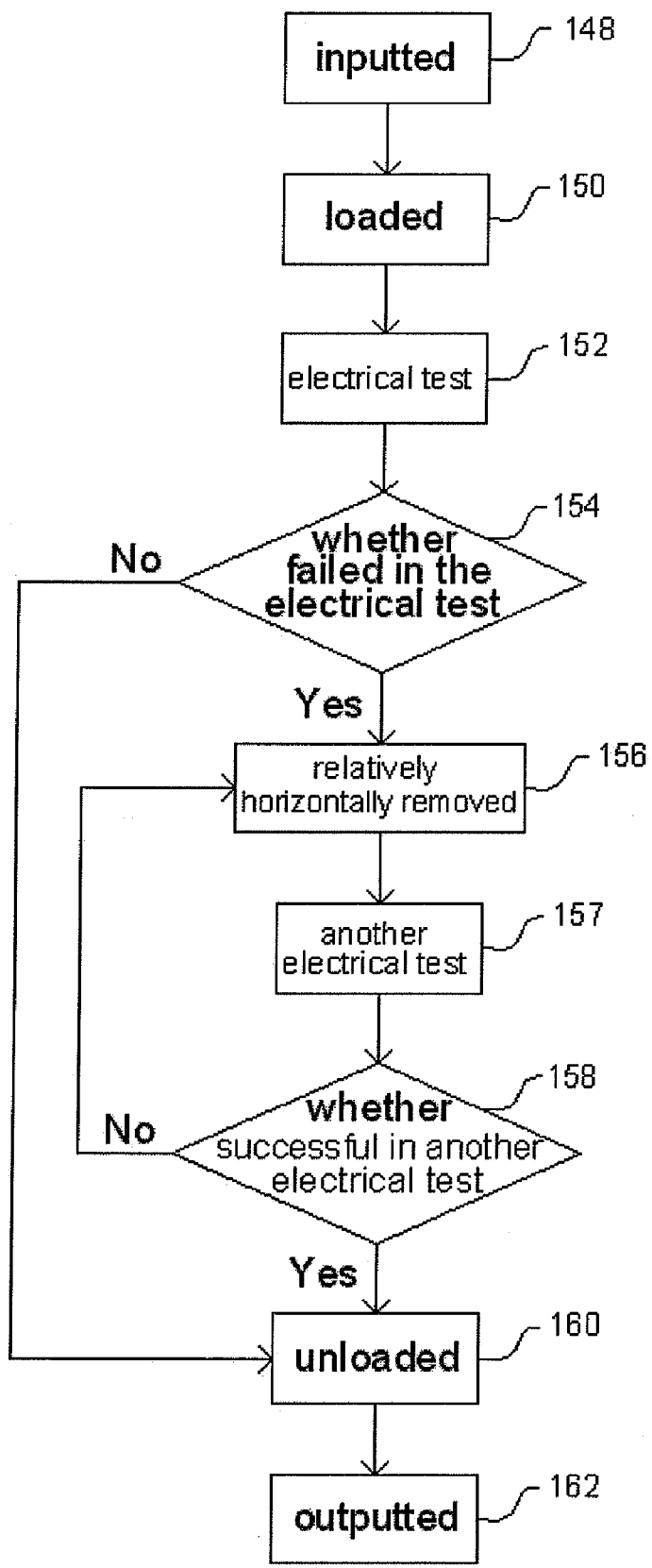
FIG. 3 is a flow chart of a strip test method of the present invention.

Referring to FIG. 3, it depicts a strip test method of the present invention. The strip test method includes the following steps. In step 148, an assembly strip is inputted in a test area, wherein the assembly strip includes a plurality of semiconductor devices, each having a plurality of leads. Generally, the semiconductor devices are assembled (packaged) on matrix-type lead frame structures in which the semiconductor devices are arranged in multiple rows and columns. In step 150, a functional test device is provided, wherein the functional test device includes a test socket and a base, and the test socket has a plurality of probe sets. The assembly strip is loaded to the base. In step 152, the probe sets of the test socket electrically contact the leads of the semiconductor devices of the assembly strip simultaneously, respectively so as to process an electrical test, i.e. the first electrical test. In step 154, it is judged whether any semiconductor device is failed in the first electrical test or not. If the answer is "Yes", the strip test method goes to step 156; and if the answer is "No", the strip test method goes to step 160. In step 156, when one of the semiconductor devices is failed in the electrical test, one of the base and the test socket is relatively moved (e.g. horizontally moved) in such a manner that the one of semiconductor devices which is failed in the first electrical test is corresponding to one of the probe sets which is successful in the first electrical test and is the nearest to the failed one of semiconductor devices. In step 157, the probe sets of the test socket simultaneously and electrically contact the leads of the semiconductor devices of the assembly strip so as to process another electrical test again, i.e. the second electrical test, wherein the successful and nearest one of the probe sets electrically contacts the leads of the failed one of the semiconductor devices simultaneously. In step 158, it is judged whether the one of semiconductor devices which is failed in the first electrical test is successful in the second electrical test or not. If the answer is "Yes", the strip test method goes to step 160; and if the answer is "No", the strip test method returns to step 156. In other words, if the strip test method returns to step 156, the one of semiconductor devices which is failed in the first electrical test is still failed in the second electrical test. The one of the base and the test socket is relatively moved (e.g. horizontally moved) in such a manner that the one of semiconductor devices which is failed in the second electrical test is corresponding to another one of the probe sets which is successful in the second electrical test and is the nearest to the failed one of semiconductor devices. The probe sets of the test socket electrically contact the leads of the semiconductor devices of the assembly strip simultaneously so as to process a further electrical test again, i.e. the N-th electrical test (N is an integer more than 2). If the strip test method returns to step 158 again, it is judged whether the one of semiconductor devices which is failed in the (N−1)-th electrical test is successful in the N-th electrical test or not. Otherwise, it is also judged whether the whole test time of the strip test method exceeds a predetermined time limit or not. If the answer is "Yes", the strip test method goes to step 160; and if the answer is "No", the strip test method returns to step 156.

More detailed, the strip test method is processed by a strip test automatic machine. The strip test automatic machine controls repeated test processes of the product (e.g. assembly strip) by using the function of software. The repeated test processes are characterized in that: First, when the one of the semiconductor devices is failed in the electrical test, the signal of "failed test" feeds back to the strip test automatic machine. Then, the strip test automatic machine reads the location number of row and column of the failed one of the semiconductor devices. Second, according to the location number of row and column of the failed one of the semiconductor devices, the strip test automatic machine chooses one of the probe sets of the test socket which is successful in the electrical test and is the nearest to the failed one of semiconductor devices, whereby the failed one of semiconductor devices is moved within the shortest distance and then corresponding to the chosen one of the probe sets of the test socket so as to process next test. Third, the user can set the predetermined times of the repeated test processes, and the predetermined times depends on the requirement of the user (e.g. 10 times). Fourth, if the one of semiconductor devices is still failed in the next test, the strip test automatic machine does not stop the repeated test processes until the strip test automatic machine finishes the predetermined times of the repeated test processes.

In step 160, the assembly strip is unloaded from the base. In step 162, the assembly strip is outputted from the test area.

Figure 4:
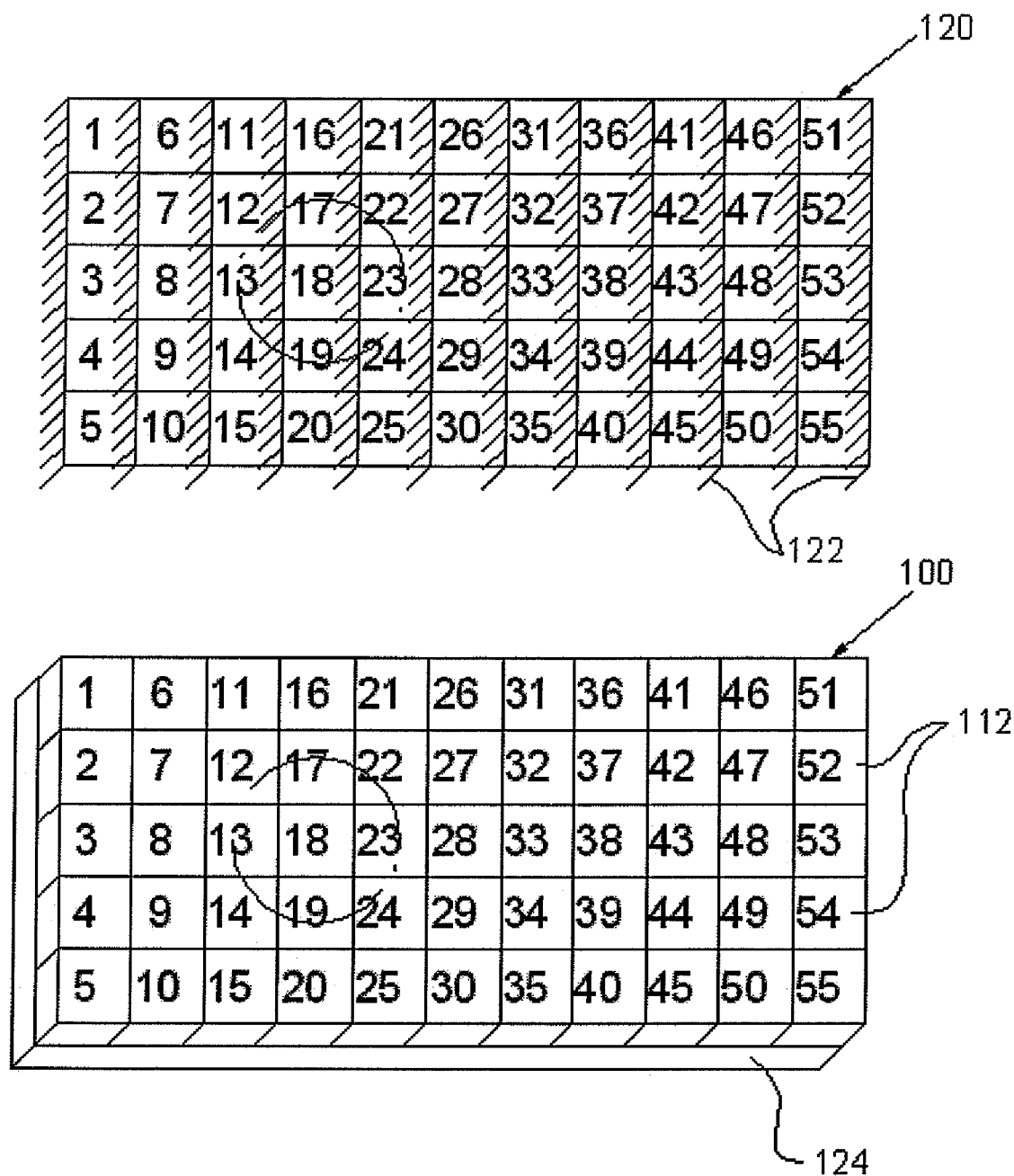
FIG. 4 is a perspective schematic view of a strip test method according to an embodiment of the present invention, showing that the probe set (the location number 18) is corresponding to the semiconductor device (the location number 18).
Figure 5:
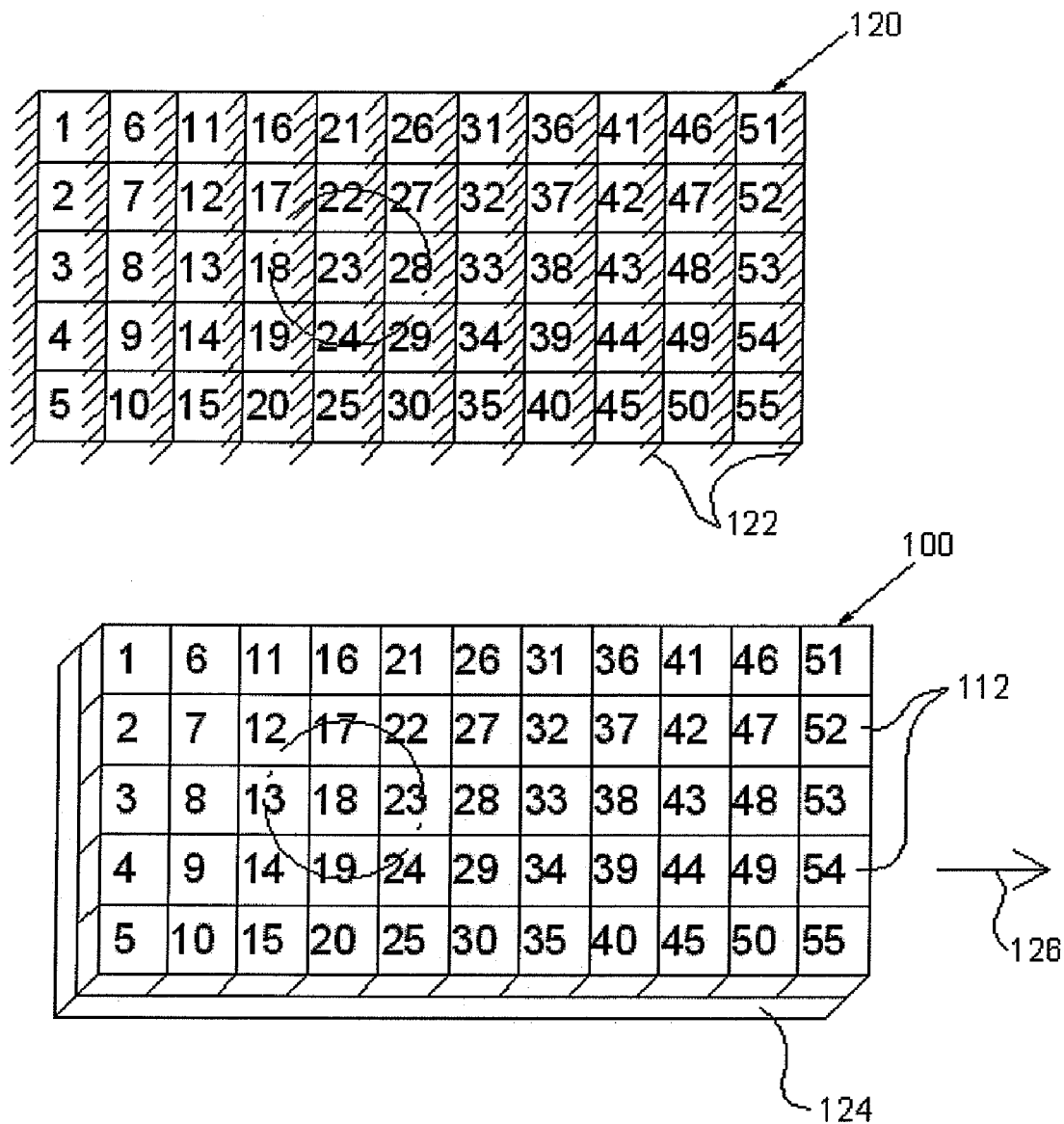
FIG. 5 is a perspective schematic view of a strip test method according to the embodiment of the present invention, showing that the probe set (the location number 23) is corresponding to the semiconductor device (the location number 18).

Referring to FIG. 4, it depicts a strip test method according to an embodiment of the present invention. Firstly, an assembly strip 100 is provided, wherein the assembly strip 100 includes 55 semiconductor devices, which are arranged in 5 rows and 11 columns on matrix-type lead frame structures. Then, a test socket 120 and a base 124 are provided, wherein the test socket 120 has 55 probe sets 122, which are also arranged in 5 rows and 11 columns on the test socket 120. Then, the assembly strip 100 is loaded to the base 124. Then, the probe sets 122 of the test socket 120 electrically contact the leads (not shown) of the semiconductor devices 112 of the assembly strip 100 simultaneously and respectively so as to process an electrical test, i.e. the first electrical test. When the semiconductor devices are electrically tested, for example, the test result is that the semiconductor device 112 (the location number 18) is failed in the first electrical test. The strip test automatic machine receives the signal of "failed test", records the semiconductor devices 112 (the location number 18) is failed in the first electrical test, and judges that probe sets 122 (the location number 13, 17, 19 and 23) are successful in the first electrical test and are the nearest to the semiconductor device 112 (the location number 18). In this embodiment, referring to FIG. 5, for example, the strip test automatic machine chooses the probe set 122 (the location number 23), whereby the semiconductor device 112 (the location number 18) is horizontally moved in the direction of the arrow 126 within the shortest distance and then corresponding to the probe set 122 (the location number 23). Then, the probe sets 122 of the test socket 120 are simultaneously and vertically moved so as to process another electrical test, i.e. the second electrical test. In an alternative embodiment, it is apparent to one of ordinary skill in the art that "the semiconductor device 112 (the location number 18) is horizontally moved and then corresponding to the probe set 122 (the location number 23)" can be replaced with "the probe set 122 (the location number 23) is horizontally moved and then corresponding to the semiconductor device 112 (the location number 18)." After the second electrical test (i.e. another electrical test), the signal of "successful test" will be stored at the location number 18 so as to be the final test result of the location number 18 if the probe set 122 (the location number 23) is successful in the second electrical test, i.e. the semiconductor devices 112 (the location number 18) is successful in the second electrical test. After the semiconductor device 112 (the location number 18) is successful in the second electrical test, the assembly strip 100 is unloaded from the base 124.

Compared with the prior art, the strip test method of the present invention is not required to unload the assembly strip from the base first after an electrical test of the assembly strip is finished. If some semiconductor devices are failed in the electrical test, another electrical test of the assembly strip can be directly processed so as to avoid increasing manufacturing time. Furthermore, when another electrical test of the assembly strip is processed again, the semiconductor devices which are failed in the first electrical test can be electrically tested again by the probe set in which the test is successful in the first electrical test, whereby the test result of the second electrical test of the semiconductor devices can be correct.

Although the invention has been explained in relation to its preferred embodiment, it is not used to limit the invention. It is to be understood that many other possible modifications and variations can be made by those skilled in the art without departing from the spirit and scope of the invention as hereinafter claimed.

What is claimed is:

1. A strip test method, comprising the steps of:
   providing a assembly strip, wherein the assembly strip includes a plurality of semiconductor devices each having a plurality of leads;
   providing a test socket and a base, wherein the test socket has a plurality of probe sets;
   loading the assembly strip to the base;
   electrically contacting the leads of the semiconductor devices with the probe sets simultaneously and respectively so as to process a first electrical test;
   relatively moving one of the base and the test socket when one of the semiconductor devices is failed in the first electrical test in such a manner that the failed one of semiconductor devices is corresponding to one of the probe sets which is successful in the first electrical test and is the nearest to the failed one of semiconductor devices; and
   electrically contacting the leads of the failed one of the semiconductor devices with the successful and the nearest one of the probe sets simultaneously so as to process a second electrical test.

2. The strip test method as claimed in claim 1, further comprising the steps of:
   relatively moving the one of the base and the test socket when the one of semiconductor devices is still failed in the second electrical test in such a manner that the failed one of semiconductor devices is corresponding to another one of the probe sets which is successful in the second electrical test and is the nearest to the failed one of semiconductor devices; and
   electrically contacting the leads of the failed one of the semiconductor devices with the another successful and the nearest one of the probe sets simultaneously so as to process a N-th electrical test, wherein N is an integer more than 2.

3. The strip test method as claimed in claim 2, further comprising the step of:
   unloading the assembly strip from the base when the one of semiconductor devices which is failed in the (N−1)-th electrical test is successful in the N-th electrical test.

4. The strip test method as claimed in claim 2, further comprising the step of:
   unloading the assembly strip from the base when the whole test time of the strip test method exceeds a predetermined time limit.

5. The strip test method as claimed in claim 1, further comprising the step of:
   unloading the assembly strip from the base when the one of semiconductor devices which is failed in the first electrical test is successful in the second electrical test.

6. The strip test method as claimed in claim 1, wherein the semiconductor devices are assembled on matrix-type lead frame structures in which the semiconductor devices are arranged in multiple rows and columns.

7. The strip test method as claimed in claim 1, wherein the test socket and the base are deposed in a functional test device.

* * * * *